United States Patent [19]

Glaberson

[11] 4,376,916
[45] Mar. 15, 1983

[54] SIGNAL COMPRESSION AND EXPANSION SYSTEM

[75] Inventor: John B. Glaberson, Stamford, Conn.

[73] Assignee: CBS Inc., New York, N.Y.

[21] Appl. No.: 154,729

[22] Filed: May 29, 1980

[51] Int. Cl.³ .......................... H03G 3/20; H04B 3/28
[52] U.S. Cl. .................................. 330/136; 330/126; 330/138; 333/14
[58] Field of Search ............... 330/144, 126, 284, 129; 455/72; 333/14

[56] References Cited

U.S. PATENT DOCUMENTS

| 3,665,345 | 5/1972 | Dolby | 333/14 |
| 3,798,562 | 3/1974 | Takahashi | 330/283 |
| 4,220,929 | 9/1980 | Talbot et al. | 330/136 |

FOREIGN PATENT DOCUMENTS

| 1149891 | 4/1969 | United Kingdom . |
| 2000945A | 1/1979 | United Kingdom . |

Primary Examiner—James B. Mullins
Assistant Examiner—Gene Wan
Attorney, Agent, or Firm—Spencer E. Olson

[57] ABSTRACT

An improved system for compressing or expanding the dynamic range of an electrical input signal of the type which includes a variable gain device for controlling the gain of the input signal and a circuit for generating a control signal for the variable gain device including a rectifier for producing responsively to the input signal a DC signal which substantially follows dynamic variations of the input signal. The improvement resides in the provision in the control signal generating circuit of a network of at least three signal paths having a common input terminal connected to receive the DC signal and a common output terminal connected to the variable gain device for coupling a control signal thereto, which signal paths have differing time constants and are automatically selectable as a function of the rate and amount of change in amplitude of the DC signal.

25 Claims, 6 Drawing Figures

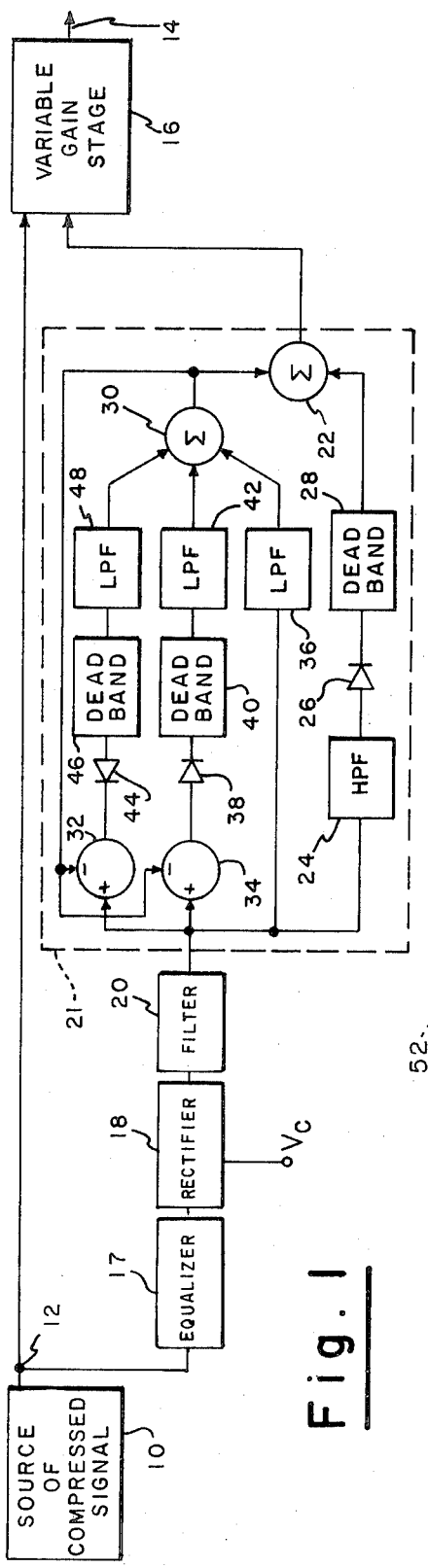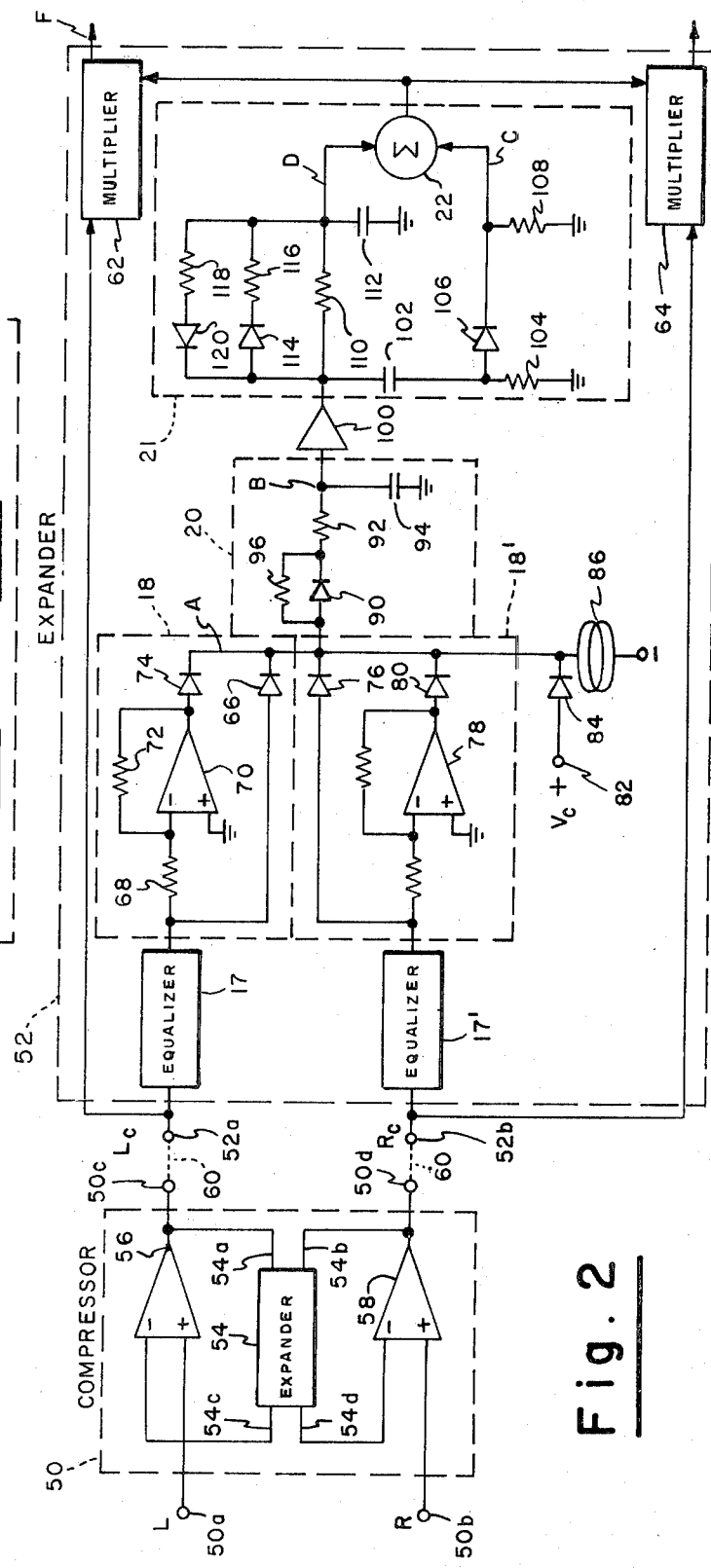

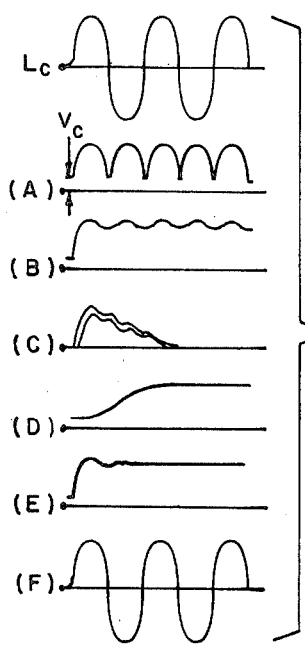
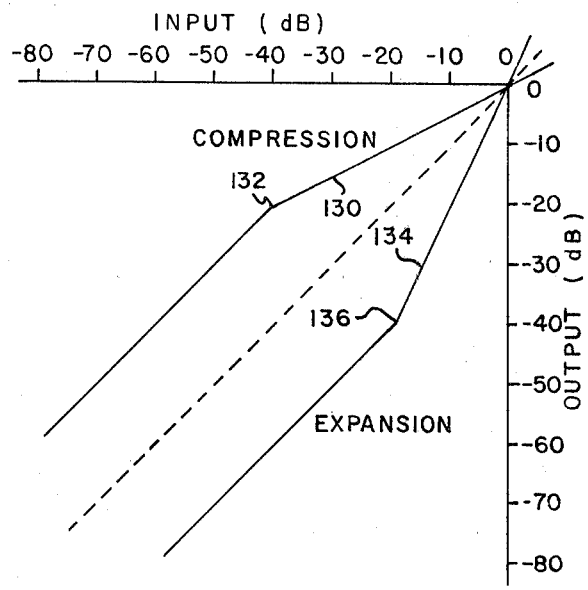
Fig. 3
Fig. 4
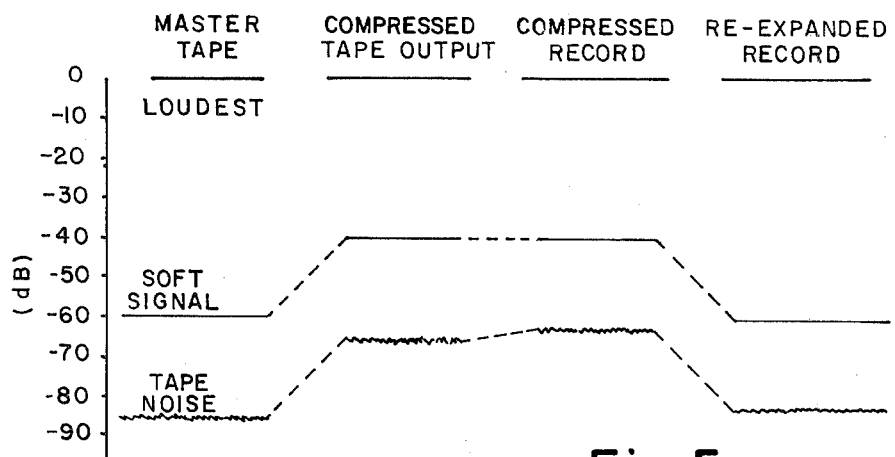
Fig. 5
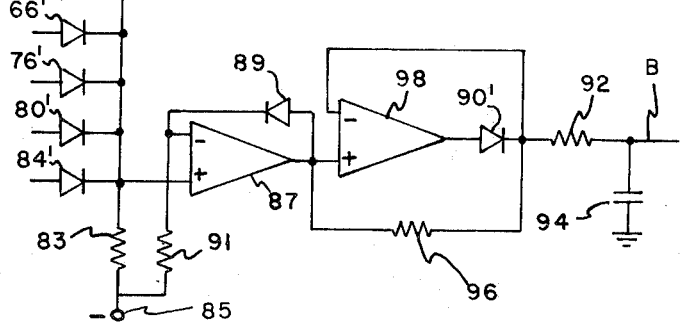
Fig. 2A

SIGNAL COMPRESSION AND EXPANSION SYSTEM

BACKGROUND OF THE INVENTION

The present invention relates to automatic dynamic compression and expansion systems, particularly for use in sound recording and reproducing systems.

It is known that the dynamic range of much program material is considerably greater than can be accommodated by currently available sound recording and reproducing systems. For example, orchestral music in a concert hall may have a dynamic range as great as 85 db, whereas an average phonograph system, of which the record is the limiting component, can only accommodate a dynamic range of perhaps no more than 65 db. Compander systems are known in which the program signals are compressed in amplitude before they are recorded, and are expanded in complementary fashion in the reproducing process so as to restore the original dynamic range to the signal. It is also known that the process of compression and expansion increases the perceived signal-to-noise ratio by reducing the effect of noise originating from the record disc (or other recording medium) on the signal being processed.

Another approach to compansion is the so-called Dolby B audio noise reduction system, developed primarily to improve the reproduction of tape cassettes. Such systems comprise a summing amplifier receiving, at one input, the audio signal to be transmitted over the noisy channel, and at the other summing input, a signal from a network which compresses a band of high frequencies by a factor varying inversely with the audio signal in that frequency band. This system, by providing two summed signals to the noisy channel, one a straight through signal, has a non-linear characteristic on the decibel scale. The philosophy of this approach is that the straight through signal is dominant at high signal levels and minimizes the distortion resulting from high level signals and transitions between low level and high level signals. Expansion of the signal recovered from the noisy channel is keyed to the level of the recovered signal. By compressing the band of high frequencies according to the signal content of this frequency band, and by using a logarithmically non-linear compression technique, significant frequency distortion can result if the signal level recovered from the noisy channel is not carefully adjusted to be identically the same as the signal level applied to the channel.

While the Dolby B system has enjoyed acceptance in the recorded tape field, the technique is generally unacceptable for use in the recording and reproduction of phonograph records, particularly when it may be desired to reproduce the record without first expanding the recorded compressed signal. That is, unless the signals compressed according to the Dolby technique (or by other systems which in the compression process separate the components of the source signal into two or more frequency bands) are expanded before reproduction, the reproduced signal will be badly altered in frequency response and artistically unacceptable.

Another known companding system that provides a great deal of noise reduction is one manufactured by dbx Company, the details of which are described in U.S Pat. Nos. 3,681,618, 3,789,143 and 3,714,462. This system, like Dolby B, is optimized for high frequency noise reduction; the compressor and expander function over the audio frequency spectrum, but the control signal is strongly pre-emphasized so that high frequencies control the gain. Among the reasons that this companding system is undesirable for use with phonograph records, particularly when it may be desired to reproduce the record without expansion, is that the high frequencies controlling the gain have short time constants and therefore cause fast gain change, or "pumping", in the compressor and the expander. It also means that with a high frequency signal on the record controlling the gain of the expander, there is low frequency preemphasis on playback which causes drastic modulation of "rumble" on the record. The dbx system was designed primarily for tape use and is not optimized for disc record use. Also, it is not "compatible" (in the sense that a disc record containing a signal compressed with a dbx compressor can be acceptably reproduced without first expanding the signal), nor does it have proper noise reduction characteristics for use on disc records.

Another known noise reduction system is the "High-Com" compander manufactured by Telefunken, Hannover, Germany, the details of which are described in a Telefunken publication dated April 1979. This system is similar in operation to the dbx system except that the compression and expansion characteristics have break points at high and low signal amplitude levels beyond which there is no compression or expansion. This alleviates some of the "pumping" that is encountered when it is attempted to use the "High-Com" system in the recording and reproduction of phonograph records, but otherwise it has most of the above-outlined drawbacks of the dbx system.

In summary, although all three of these currently best known noise reducing companding systems, namely, Dolby B, dbx and the Telefunken system, provide significant signal-to-noise improvement in the applications for which they were designed, neither is acceptable for use in the recording and reproduction of disc records, particularly when it may be desired to reproduce, without first expanding, a compressed record. In particular, the compression process of each of these systems sufficiently alters the original information signal that unless it is complementarily expanded before reproduction the results are artistically unacceptable.

Of the companders heretofore proposed for use in the recording and reproduction of sound signals on disk records, the most relevant to the present invention of which applicant is aware is that described in commonly assigned U.S. Pat. Nos. 3,197,712 to Bauer, and 3,230,470 to Kaiser. One embodiment of the Bauer system automatically modifies the gain of the useful signal transmission channel in response to signal volume level. Modification of the characteristic does not take place continuously as the signal volume varies but, rather, is effected in such fashion as to permit a given range of signal level variation during which the characteristic remains constant before modification of the characteristic occurs. One way of accomplishing this is to provide for continuous modification of the gain with increasing signal levels, but no modification with decreasing signal levels until the signal level has dropped a predetermined amount, thus providing a "platform" at which the characteristic is not changed. Kaiser U.S. Pat. No. 3,230,470 describes a system embodying the principles of the Bauer patent, but utilizing alternative circuitry for automatically modifying the gain characteristic of the signal transmission channel. More particularly, the transmission channel incorporates a variable gain amplifier responsive to a control signal for modifying the gain of the amplifier and means for developing such control signal by charging a capacitance through diodes connected in parallel to provide oppositely directed paths for current to and from the capacitor, respectively. The diode in the charging path is biased so as to remain non-conducting until the voltage input to the diodes has risen a predetermined amount above the bias voltage; the fixed bias employed for this purpose establishes the limits of the "platform" or range of variation in signal for which no modification of the transmission channel characteristic takes place.

Although these systems, by virtue of effecting gain modification in a linear mode, with provision for a signal level range "platform" in suitable extent at each signal level in which the gain does not change, to a significant extent accomplish gain modification without perceptible deterioration of the intelligence carried by the signal, they do not respond properly to certain types of signals encountered in the recording of music, for example, and cause a certain amount of deterioration of the information signal discernible to listeners who, in general, have become more discriminating in the interim since these systems were introduced. Moreover, these systems do not mask noise introduced by the record medium as effectively as desired by discriminating listeners. Further, if the channel contains impulse noise, which a record does, the impulse can change the expander gain indefinitely, with wholly unacceptable results.

It is an object of the present invention to provide a compression-expansion system which makes it possible to compress the dynamic range of a signal, with attendent masking of record medium noise, yet enabling the intelligence carried by the signal to be acceptably reproduced without first expanding the compressed signal, and when the reproduced signal is subjected to complementary expansion, substantially the entire dynamic range can be restored with highly effective masking of record surface noise. Stated another way, the primary object of the invention is to provide a compander system the compressor of which is capable of compressing the dynamic range of a program signal to enable its being recorded on a phonograph record or other noisy medium and to achieve effective masking of the medium noise, yet is compatible with uncompressed records in that the sound signal reproduced therefrom, even without expansion, differs very little from the source signal, and the expander of which, if used, is capable of restoring substantially the entire dynamic range with highly effective masking of record surface noise.

SUMMARY OF THE INVENTION

Briefly, this and other objects of the invention are achieved by a method of signal compression which avoids pumping effects without deleterious distortion and with a relatively simple circuit, and a method for complementarily expanding the compressed signal on playback. The compressor and expander both embody a circuit having a useful signal path between its input and its output which contains a variable gain device which is controlled by a direct voltage derived from the input signal to the useful signal path. The input signal is fed to the control voltage generator wherein it is rectified to produce a direct voltage proportional to the amplitude of the input signal when the amplitude exceeds a predetermined threshold voltage and to produce a direct voltage having the amplitude of the threshold when the amplitude of the input signal is less than the threshold voltage, whereby, in the compressor, input signals having amplitudes above the threshold are linearly compressed and signals of lesser amplitude are not compressed, and, in the expander, signals having amplitudes above the threshold are linearly expanded and those having amplitudes below the threshold are not expanded. The direct voltage from the rectifier is applied to a relatively fast acting short time constant filter, the output of which varies in amplitude with variations in the input signal envelope. The instantaneous gain of the variable gain device at any moment in time being a function of the direct control voltage, the signal derived from the filter is further processed, before application to the variable gain device, by a network of filters having differing pass characteristics which coact to effectively mask noise and minimize pumping in spite of rapid changes in level of the input signal. It has been found from extensive psychoacoustic listening experiments that the ear cannot hear a noise signal which had originally been masked by the information signal for approximately 200 milliseconds following the instant in time at which the information signal level decreases to essentially that of the noise signal, but that after approximately this time period the ear is able to hear the noise signal.

In accordance with the invention, the filter network has two primary signal branches having a common input for receiving the output of the rectifier filter, with each branch having an output connected to respective input terminals of a summing device, the output of which is the control voltage for controlling the gain of the variable gain device. The first primary branch contains a relatively fast acting high pass filter for passing rapid changes in the direct voltage and a diode that introduces a deadband equal to its forward voltage drop for preventing minor variations in the direct voltage from reaching the summing amplifier. The other primary branch consists essentially of three low pass filters for passing slow changes in the applied direct voltage, the outputs of which are summed and the resultant signal added in the summing amplifier to the signal from the first primary signal branch. A first of these three filters is simply an RC network having a relatively long time constant, of the order of 2 seconds, which passes only slowly varying signals. A second path includes a diode connected in series with a low pass filter, typically having a time constant of about 30 milliseconds, the diode being poled to conduct in response to relatively large increases in amplitude of the input signal. The third path contains a diode poled oppositely to the diode in the second path connected in series with a low pass filter having a time constant of approximately 200 milliseconds, this branch responding to large decreases in the amplitude of the direct voltage from the rectifier filter. The combined effect of the described arrangement of filters, and the deadband provided by the diodes in the primary signal branch and in two of the signal paths of the second primary signal branch, is to provide a control voltage for the variable gain stage that causes it to deliver an output signal in which the information content of the source signal is not noticeably modified. Thus, sound reproduced from a recording subjected to compression, even without expansion, differs very little musically from the original signal, and when the reproduced signal is subjected to complementary expansion, substantially the entire dynamic range can be restored with highly effective masking of record surface noise.

BRIEF DESCRIPTION OF THE DRAWINGS

Other objects, features and advantages of the invention will become apparent, and its construction and operation better understood, from the following detailed description of a preferred embodiment, taken in conjunction with the accompanying drawings, in which:

FIG. 1 is a block diagram of a noise reduction circuit according to the invention;

FIG. 2 is a diagram, partly in schematic form, of a compander incorporating an exemplary implementation of the noise reduction circuit of the invention as embodied in a stereophonic audio recording and reproducing system;

FIG. 2A is a schematic diagram of a part of the expander circuit illustrated in FIG. 2;

FIG. 3 is a series of voltage waveforms produced at various points in the system of FIG. 2 useful in explaining the operation of the system;

FIG. 4 shows the steady state compression and expansion characteristics of the system of FIG. 2; and FIG. 5 illustrates typical operating performance of the apparatus of FIG. 2.

DESCRIPTION OF THE PREFERRED EMBODIMENT

Referring now to FIG. 1, the noise reduction system of the invention is shown in block diagram form as embodied in an expander for the expansion of compressed alternating voltage signals from a source 10, such as a phonograph record having a compressed signal recorded thereon in a manner complementary with the expansion provided by the expander. As will be seen later, complementarity between compression and expansion is readily achieved by embodying the expander of FIG. 1 in the compressor; thus, the circuit of FIG. 1 is useful in either the automatic compression or expansion of a signal between its input 12 and its output 14. The circuit has a useful signal path between its input and output containing a variable gain stage 16 which is electronically controllable for varying the gain between the circuit input and output, and a control path connected to the input 12 which includes a frequency-selective control voltage generator for generating in response to the input signal and applying to variable gain stage 16 a control voltage for controlling the gain of the variable gain stage. The compressed signal from source 10, which will contain noise which is introduced by the record medium, is applied to an equalizer 17 in the form of a high pass filter for substantially reducing signal frequencies below, for example, 500 Hz and passing without reduction the balance of the frequencies, which contain most of the energy content of most audio program material. Reduction of the low frequency content, which would include record surface noise signals, reduces the effect of low frequency signals on the gain of the variable gain stage; if very low frequencies were allowed to change the gain, one would hear the amplitude of middle and upper frequencies being changed by relatively inaudible changes in the low frequency content. Further, provision of equalizer 17 allows the smoothing filter and other filters in the control signal generator to have faster time constants without passing excessive distortion-producing ripple.

The filtered AC signal is applied to a rectifier 18 which produces a direct voltage signal proportional to the magnitude of the applied alternating signal. Rectifier 18 includes a settable threshold $V_c$ such that its direct voltage output is proportional to the amplitude of the input signal when the input signal level exceeds the threshold, and is equal to the threshold voltage when the amplitude of the input signal is less than the threshold, so that input signals having amplitudes above the threshold are expanded and signals having amplitudes below the threshold are not expanded. The direct voltage signal produced by rectifier 18 is applied to a relatively fast acting short time constant filter 20 for removing to a significant degree the ripple appearing on the rectified signal. In order to prevent noticeable changes in the noise levels between absence of program and the presence of low to medium program levels, and to minimize pumping, the filtered direct voltage is further processed by a network 21 of filters having different transmission characteristics to produce the control voltage for ultimate application to variable gain stage 16.

The filter network has two primary signal branches, both connected to receive the signal from filter 20, and the outputs of the two branches are summed in a summing device 22, such as a summing amplifier, and the resultant signal is applied to and controls the gain of variable stage 16. More particularly, the first primary branch contains a high pass filter 24 connected to receive the signal from filter 20, followed by a diode 26 having a forward voltage drop, typically 0.7 volt for silicon diodes, which thus introduces a deadband, represented by block 28, the output of which is applied to one input of summing device 22. Filter 24 has a fast rise time and a decay time of approximately 30 milliseconds so as to pass peak information but not steady state signals, and the deadband introduced by diode 26 prevents small fast signal changes that exceed the amplitude of the peak signal by the forward voltage drop from passing to the summing network. In essence, the deadband provided by diode 26 removes ripple that would otherwise be passed by filter 24. Thus, relatively large and rapid changes in the information signal are passed to the summing network and minor ripples not associated with perceptible changes in the information signal are removed.

The second primary signal branch includes three signal paths to the inputs of which the output from filter 20 is applied and the outputs of which are summed in a summing junction 30; the output of the summing junction is applied as a second input to summing device 22, and is also subtracted from the input signal to the upper two signal channels in summing junctions 32 and 34, respectively. The lowest of the upper three signal paths contains only a low pass filter 36 having a relatively long time constant, typically about 2 seconds, which passes to summing junction 30 only essentially steady state or slowly varying signals. The function of this path is to establish the steady state characteristics of the compander, that is to say, it determines the response of the system to very slowly changing signals. The intermediate signal path contains a diode 38 having a deadband due to its forward voltage drop, represented by block 40, and a low pass filter 42, the output of which is applied as a second input to summer 30. The upper signal path includes a diode 44 poled oppositely to diode 38 which also introduces a deadband, represented by block 46, and a low pass filter 48, the output of which is applied as a third input to summer 30. When the direct voltage from filter 20 increases from a steady state value by an amount so as to exceed the sum of the instantaneous potential at the output of summer 30 and the forward voltage drop of diode 38, diode 38 conducts and applies the increasing signal to low pass filter 42, typically having a rise time of about 30 milliseconds, the output of which is added to the control signal via summers 30 and 22. The purpose of this path is to transmit signals that exhibit a large increase in amplitude and which remains high for a relatively long period, i.e., longer than 30 milliseconds. This path does not transmit signals which show a large increase in amplitude followed immediately by a large decay in amplitude; signals having these characteristics are transmitted by the first primary branch. Thus, low pass filter 42, with its approximately 30 millisecond rise time, complements high pass filter 24, with its 30 millisecond decay time, for ensuring that the generated control voltage is proportional to an input signal having the described characteristics; for example, should the signal from filter 20 be a step function containing ripple, high pass filter 24 will pass the initial step, low pass filter 42 will take over and pass the signal when filter 24 cuts off after approximately 30 milliseconds, and when the signals from these two paths are combined the resultant signal will closely approximate the original step function, but having no long term ripple.

Reverting to the upper signal path, it responds to large decreases in amplitude of the direct voltage from filter 20. If it is assumed, for example, that the direct voltage decreases suddenly from a steady state value, the output of summing device 32 will no negative because the voltage at the output of summer 30 resulting from the previously steady signal will remain positive because of the long time constant of filter 36, thereby causing diode 44 to conduct and apply the signal to low pass filter 48, which has a time constant of approximately 200 milliseconds, and the filter output to be added to the control signal via summers 30 and 22. The upper path primarily enhances the operation of the expander rather than the compressor, and enables the compander to respond to a large decrease in signal amplitude, and therefore reduce channel noise quickly. As previously indicated, carefully controlled tests involving wide varieties of music and speech programs have revealed that the ear cannot hear, for approximately 200 milliseconds following a sudden drop of the output signal, a noise signal which has previously masked by the information signal. After a period of 200 milliseconds the ear is, in this situation, able to detect the presence of noise, but by this time low pass filter 36 will have taken over to provide a very slow decay of the noise, so that any noise signal that is heard is perceived as being at a reasonably steady level; that is, it does not appear to be moving or "swishing" around.

Summarizing the overall operation of the described filter network, it is seen that small increases or decreases in signal amplitude will be passed only by low pass filter 36 because of the deadband in all of the other signal paths. A signal exhibiting a fast, large increase in amplitude will be passed by high pass filter 24, and if the amplitude remains high it will then be passed by the signal path containing low pass filter 42, and eventually low pass 36 will start to add to the mix of voltages that make up the final control signal. If there is a large, fast decrease in signal amplitude, the signal path containing low pass filter 48 provides a fast relatively slow change in the amplitude of the control signal, and if the amplitude stays at the decreased level, the path containing low pass filter 36 also contributes to the control voltage. The signal paths containing high pass filter 24 and low pass filter 42 cannot respond to a decrease in signal amplitude because of diodes 26 and 38 and, accordingly, do not contribute to the decreasing control signal.

FIG. 2 shows a compander system comprising a compressor 50 and an expander 52, the latter being shown in schematic form and illustrating a presently preferred implementation of the system illustrated in block diagram form in FIG. 1. The invention is shown as embodied in a stereophonic recording and reproducing system wherein left and right channel signals L and R from a signal source, such as a master tape, are applied to input terminals 50a and 50b, respectively, of compressor 50 for producing compressed left and right signals $L_C$ and $R_C$ at its output terminals 50c and 50d, respectively. Compressor 50 includes an expander 54 identical in construction and operation to expander 52 connected in the feedback paths of a pair of operational amplifiers 56 and 58. More particularly, the left and right source signals L and R are rpesectively applied to the positive inputs of operational amplifiers 56 and 58, the left channel of expander 54 is connected between the output terminal 50c and the negative input of amplifier 56, and the right channel of the expander is connected between the output of amplifier 58 and its negative input. As will be seen following a detailed description of expander 52, similarly compressed left and right sound signals $L_C$ and $R_C$ are produced at output terminals 50c and 50d of the compressor, the nature of the compression being such as to be complementary with the expansion provided by expander 52. The dotted line connections 60 between the output terminals of compressor 50 and the input terminals of expander 52 represent a noisy channel, such as a phonograph record.

The compressed signals $L_C$ and $R_C$ derived from the noisy channel are respectively applied to input terminals 52a and 52b of expander 52 to which are connected the inputs of respective useful signal paths each containing a variable gain device, such as multipliers 62 and 64, respectively, from which re-expanded left and right signals are respectively derived. The multipliers are essentially non-frequency selective and may be conventional two-quadrant multipliers, such as the Type LM13600 commercially available from National Semiconductor, adapted to variably amplify an alternating current input signal under control of a unipolar control signal, in the present embodiment a positive voltage.

The compressed input signals are each also applied to a respective equalizer 17 and 17' for filtering out the low frequency content of input signal and the filtered AC signals are applied to respective rectifiers 18 and 18' for generating a direct voltage dominantly proportional to the amplitude of the middle and upper frequency content of respective input signals; the rectifiers being identical, only rectifier 18 will be described in detail. The $L_C$ signal is applied to the anode of a diode 66, and also via a resistor 68 to the inverting terminal of a phase-inverting amplifier 70 having a resistor 72 connected between its output and inverting input of the same resistance value as resistor 68 so as to have unity gain. The inverted $L_C$ signal is applied to the anode of a diode 74, the cathode of which is connected to the cathode of diode 66 and to a common output line labelled A. Similarly, the right channel signal is applied to the anode of a third diode 76, and also to the input of a unity gain inverting amplifier 78, the output of which is applied to the anode of a fourth diode 80. The cathodes of diodes 76 and 80 are connected together and to the common output line A. A threshold level for determining the signal level below which there is no expansion and above which there is to be linear expansion is established by a source of positive DC potential, represented by terminal 82, connected through a diode 84 to the common output line A. The common output line is also connected to a current sink 86 referenced to a negative potential.

To achieve the rectifier operation about to be described, all of diodes 66, 74, 76, 80 and 84 are "ideal" in that they must exhibit no forward voltage drop. This characteristic is readily achievable by the circuit arrangement fragmentarily shown in FIG. 2A consisting of five conventional silicon diodes 74', 66', 76', 80' and 84', each of which has a forward voltage drop of about 0.7 volt, the cathodes of which are connected together and through a resistor 83 to a source of negative DC potential, represented by terminal 85. The cathodes of all the diodes are connected to the positive input of an operational amplifier 87, the output terminal of which is connected via a diode 89, of the same type as diodes 74', 66', etc., to its negative input, which is also connected through a resistor 91 to the source 85 of negative potential. The described circuit is essentially a voltage follower in which one diode voltage drop is added to the feedback so as to cause the output of amplifier 87 to be one "diode drop" more positive than the signal applied to its positive input. This is equivalent to using "ideal" diodes for the five diodes in the rectifier section.

The DC reference potential $V_C$ and its associated diode 84 establish a reference against which the two full-wave rectified signals are compared, the described connections serving to select for application to output line A the largest of the signals instantaneously appearing at the cathodes of the five diodes. However, should none of the signals at the cathodes of the other four diodes have a peak value higher than $V_C$, the output on line A will be the voltage $V_C$ regardless of the level of the input; since the direct potential on line A eventually becomes the control signal for multipliers 62 and 64, the potential $V_C$ fixes the gain of the useful signal paths for input signals having amplitudes lower than the threshold. Although the threshold level is susceptible of a range of values, the particular value chosen being based on the spectrum and amplitude of the noise likely to be encountered in the noisy channel, and is set to prevent low level signals, or low level noise, from changing the gain of the useful signal path; this is particularly important because it is during low signal levels that one hears noise and other extraneous signals being modulated by the information signal. The threshold determines where compression begins, and the amount of compression determines the amount of noise reduction that will be realized upon expansion. The amount of compression also determines the amount of change in dynamic range that is heard when a compressed record is reproduced without expansion; that is, maximum compatibility is achieved with minimum compression, at the expense, however, of very little noise reduction. Thus, the choice of threshold level is a compromise between the amount of compression that is tolerable in the unexpanded playback of the compressed signal and a meaningful amount of noise reduction; a compressor input threshold of −40 db has been found to be a practical compromise for the case where the compressed signal is recorded on a conventional phonograph record.

FIG. 3 is a graph of signal waveforms appearing at various points in the circuit of FIG. 2 when a sine wave tone burst is the input signal to rectifier 18; the same result would be obtained if the same tone burst were applied to input terminal 52b. The full-wave rectified signal produced at output line A is depicted by waveform (A) of FIG. 3, the negative-going excursions of the rectified signal being limited at the level $V_C$. This signal is applied to smoothing filter 20 consisting of a diode 90 connected in series with a resistor 92, a capacitor 94 connected from one terminal of resistor 92 to a point of reference potential, in this case ground, and a resistor 96 connected in parallel with diode 90. The values of resistor 92 and capacitor 94 are selected to give an attack time constant of about 1 millisecond; the sum of the resistance values of resistors 92 and 96 and the value of capacitor 94 determine the decay time constant, typically about 10 milliseconds. Actually, because resistor 96 is connected to the input of the filter rather than to ground, the filter has a variable decay time; it exhibits the full decay time of resistors 92 and 96 when the input signal goes to zero, but is longer if the signal is returning to an intermediate value and further reduces ripple. As illustrated in waveform (B) of FIG. 3, because of its fast rise time filter 20 quite faithfully detects the envelope of the applied signal but, as is usual with such filters, the output signal has some ripple.

The described filter operation depends on diode 90 also being an "ideal" diode, and in a specific implementation, shown in FIG. 2A, the effect of a diode having no forward voltage drop is achieved by connecting a silicon diode 90' in the feedback path between the output terminal and the negative input of an operational amplifier 98, to the positive input of which the output of amplifier 87 is connected. Resistor 96 is connected across the series combination of amplifier 98 and diode 90', and the junction of the diode and resistor 96 is connected to the filter resistor 92. In keeping with the principles of operational amplifiers, if the positive input to amplifier 98 is more negative than its output (which is also the negative input) the output will go negative to try to eliminate the difference between the inputs; obviously, this cannot happen because diode 90' cannot pass current in that direction. However, if the positive input of the amplifier is more positive than its output, the amplifier will try to make the output sufficiently more positive to eliminate the difference between the two inputs; this can occur since the real diode 90' will conduct. Summarizing, any time the positive input to the amplifier is more positive than the output, the output is brought to the same voltage as the input, and if the positive input is more negative than the output, nothing happens at the output. Thus, the system behaves as an "ideal" diode in that it conducts whenever, and only when, the input is more positive than the output.

The filtered signal developed across capacitor 94 is coupled through a unity gain buffer amplifier 100 to the filter network 21, which is functionally equivalent to the filter network described in FIG. 1. The first major signal branch comprises a high pass filter consisting of a capacitor 102 connected in series with a resistor 104 to ground, the signal developed across resistor 104 being coupled through a diode 106 to one input of the summing device 22, which may be a conventional summing amplifier. A resistor 108 is connected from the cathode of diode 106 to ground for returning the voltage across the diode to zero when it is not conducting. The values of capacitor 102 and resistor 104 are selected to provide a decay time constant of about 30 milliseconds. Upon application of the waveform (B) signal, the signal developed across resistor 104 is as depicted by the upper trace of waveform (C) of FIG. 3, which is seen to quite closely follow the fast rise portion of signal (B), and may have a certain amount of low amplitude ripple, or noise, or other extraneous signals thereon. When this signal is subjected to the approximately 0.7 volt "deadband" of diode 106, the low amplitude ripple and noise are eliminated after the diode stops conducting and the resulting signal applied to summing junction 22 has the waveform shown in the lower trace of waveform (C). It is seen that the signal applied to the summer corresponds essentially to the fast rise portion of waveform (B) but then drops off after about 30 milliseconds, the exact time depending on the amplitude of the applied signal, following which this branch applies no signal to summer 22. Such ripple that appears at the commencement of signal (B) that is not eliminated by the action of diode 106 will be passed by this signal branch, but by virtue of the short time constant it diminishes rapidly and after about 30 milliseconds is entirely eliminated. While it is important to minimize ripple as much as possible to minimize the distortion it may cause in the information signals delivered by the multipliers, since distortion is not audible at the start of a transient, a certain amount of ripple can be tolerated.

The other major signal branch of filter network 21 has three signal paths, the outputs of which are connected together and to a second input to summer 22. A first of these paths contains only a low pass filter consisting of a rather large charging resistor 110 connected to one terminal of a capacitor 112, the other terminal of which is connected to ground, with the junction of the resistor and capacitor connected to the second input to summer 22. The values of resistor 110 and capacitor 112 are selected to give a time constant of about 2 seconds; thus, this signal path passes to summer 22 essentially only steady state or very slowly varying signals.

A second signal path in the second primary branch contains a low pass filter consisting of a charging resistor 116 and capacitor 112, the value of resistor 116 together with the value of capacitor 112 providing an attack time constant of about 30 milliseconds. A diode 114 connected in series with resistor 116 causes this signal path to respond to input signals that increase in amplitude from a steady state value, but only when the amplitude exceeds a voltage equal to the sum of the voltage instantaneously appearing across capacitor 112 and the approximately 0.7 volt forward voltage drop or "deadband" of diode 114. Thus, this branch transmits to summer 22 signals which exhibit a large rise in amplitude and which remain high for a period in excess of about 30 milliseconds; signals which have a large rise in amplitude and almost immediately decay by a large amount are not transmitted by this path but, rather, are passed by the high pass filter of the first primary signal branch. Its response to the applied voltage signal (B) would be as depicted in waveform (D), which when added to signal (C) results in an output signal (E) from summer 22 having a fast rise portion closely approximating that of signal (B), and while it has some ripple near its beginning the signal is essentially free of ripple following cessation of conduction of diode 106 in the first branch.

The third signal path in the upper branch contains a low pass filter consisting of a resistor 118 and capacitor 112, the resistor 118 having a value to provide an attack time constant of about 200 milliseconds. By virtue of a diode 120 connected between the input to this path and resistor 118, and poled oppositely to diode 114, this path responds to relatively large decreases in amplitude of the input signal. More particularly, if the input signal should suddenly decrease in amplitude from a previous generally steady state value by an amount exceeding the sum of the voltage then present on capacitor 112 and the forward voltage drop of diode 120, diode 120 will conduct and apply the signal to the low pass filter and thence to the second input of summer 22. Thus, the voltage on capacitor 112, which always remains positive because of the time constants of the three signal paths in the upper branch, provides a dynamic reference level against which the input signal is continuously compared.

Summarizing the operation of filter network 21, any small increase or decrease in amplitude of the applied signal will be passed only by the low pass filter consisting of resistor 110 and capacitor 112 because of the deadband provided in all of the other channels by respective diodes. Any large, fast increases in signal amplitude will be passed by the first primary branch, and if the amplitude continues to be high, it will then be passed by filter R116C112 and eventually by filter R110C112. A large, fast decay in signal amplitude will initially be passed only by the filter R118C112 because of the long time constant of filter R110C112 and the diodes in the other two branches; however, should the signal remain at reduced amplitude for a significant time it will be passed by filter R110C112. The contributions of the four signal paths are added in summing network 22 to produce at the output terminal thereof for application to the control element of each of multipliers 62 and 64 a direct positive voltage proportional to the amplitude of the input signal $L_C$ increased in level by the reference voltage $V_C$. Because the gain of multiplier 62 is at any instant in time a function of the direct control voltage and, in itself, does not discriminate against frequency, the complex audio program signal appearing at the output E of multiplier 62 is unaltered in frequency response and corresponds essentially to the input signal. The gain of the multiplier increases in response to the value of the DC control signal fed thereto, resulting in expansion of the audio signal applied to the useful signal path. In a successfully operated implementation of the described expander, the output of the multiplier (in volts) is the product of the input signal and the control signal (both in volts) divided by a constant, the constant being the value of the control voltage to give a gain of one at the chosen zero level.

Since in the described example there is no $R_C$ input, there will be no output from multiplier 64. However, with both left and right signals applied to the expander the generated control signal is proportional to the largest instantaneous amplitude of the two input signals and when applied to both multipliers prevents any shift in the stereo image that might otherwise occur if separate control voltage generators were provided for the left and right channels. It is to be understood, however, that the principles of the invention are equally applicable to a single channel companding system.

Reverting now to the compressor 50, as previously indicated it has an expander 54 identical to the one just described connected in feedback relationship between the output terminals of operational amplifiers 56 and 58 and the negative inputs thereof. More particularly, input terminals 54a and 54b of expander 54 correspond to input terminals 52a and 52b of expander 52, and the output terminals 54c and 54d correspond to the output terminals of multipliers 62 and 64, respectively. Because an operational amplifier tries always to make its two inputs equal necessitates that the input to expander 54 be whatever is required to make its output equal to the input signals L and R. That this is the case can be visualized by assuming that the output terminals of compressor 50 are connected to the input terminals 52a and 52b of expander 52; since the input of expander 54 is whatever is necessary to make the output equal to the input to the compressor, then, since expander 54 and expander 52 are identical, expander 52 will have exactly the same output signals as the signals applied to terminals 50a and 50b of the compressor. This ensures complementary behavior between the compressor and expander, which is preserved over the designed range of compression and expansion.

FIG. 4 is a common type of signal level diagram depicting the steady state transfer characteristics of the described compander system. The input signals to be processed for compression or expansion are represented along the abscissa between −80 db (an assumed threshold of the noise of the master tape source) and a standard operating level of 0 db. The absolute value of the input voltage rises along the abscissa from left to right up to the rated level. The output levels for compression or expansion are represented along the ordinate between −80 db and 0 db. The absolute value of the output voltage rises along the ordinate, from the bottom to the top, up to the rated level.

Curve 130 represents the relation between the output and input levels of the compression circuit 50 of FIG. 2. For input signal levels between −80 db and −40 db there is a constant gain; that is, characteristic 130 for this range of input signal level has a compression slope of one, so that input signal levels lower than −40 db relative to the rated level are not compressed. For input signal levels higher than −40 db relative to the rated level, the characteristic has a 2-to-1 compression slope; that is, beginning with a signal input level of −40 db the gain of the multipliers continues to decrease and at an input level of 0 db have a gain of one; above 0 db the curve 130 continues with a 2-to-1 slope. It can be seen that the dynamic range of input signals between −80 db and 0 db has been reduced to a range between −60 db and 0 db for the output signals. The break point 132 in the characteristic 130 occurs when the amplitude of the input signals begin to exceed the theshold $V_C$. The break point is relatively sharp, and while it may occur at input levels other than −40 db, depending on the nature of the noise likely to be encountered in the recording and reproducing system, it is significant to the performance of the system that the slope of the characteristic be exactly one for input signal levels below the break point.

For the described case, the expansion takes place in a manner complementary to the compression, namely, according to the characteristic 134 which has a slope of one for input signal levels below −20 db and at break point 136 has a 1-to-2 slope for input signal levels in the range from −20 db to 0 db. Again, the break point 136 is fairly sharp, and while it may be at a level different from −20 db (provided the break point of the compressor characteristic is correspondingly changed), the slope of the characteristic below the break point is exactly one, which results in a significant reduction in the modulation of noise by the information signal. It is seen that the dynamic range of compressed signals between −60 db and 0 db has been restored to the original dynamic range between −80 db and 0 db.

The overall operation of the companding system according to the invention is diagrammatically illustrated in FIG. 5 as applied to the recording on a disk record of audio information signals derived from a master tape source. Starting at the left of the diagram, a master tape made preparatory to recording on a disk typically has a dynamic range of about 85 db from the loudest musical passages, represented by the 0 db level, to the level of the tape noise, and if the tape is carefully prepared the softest musical passages are from 60 to 65 db lower than the loudest passages, somewhat above the level of tape noise. Since even a good disk surface can accommodate no more than perhaps a 65 db range from the loudest passages to the surface noise of the record, the signal from the master tape must be compressed before the record master is cut. The described example of the compressor according to the invention in the absence of signal, has a gain of 20 db which brings the tape noise up from approximately −85 db to about −65 db, and brings the softest signal up from about −60 db to about −40 db, since the gain of the compressor does not change below −40 db. When the compressed master tape is recorded on a disk record, which itself has about a −65 db noise level, the record and tape noise add statistically to raise the noise level by about 3 db, resulting in a signal-to-noise ratio from the loudest signal to the background noise of about 62 db in the compressed record; the soft signal stays at −40 db. When, now, the compressed record is played through expander 52, the noise, in the absence of signal, will be approximately 82 db since, again, there is 20 db of expansion. The soft signal is restored to its initial −60 db level, thus restoring the dynamic range between the loudest and softest musical passages to substantially what it was on the master tape.

It is to be noted that the signal-to-noise ratio of the compressed master tape is not significantly different from the signal-to-noise ratio of the compressed record; however, because tape noise has an entirely different spectrum than the record surface noise it is quite easily heard in the reproduced sound and can be disturbing since to some degree it varies with signal level after compression. It is therefore essential that the original master tape be as free from noise as possible.

The invention thus provides in a circuit for automatic compression or expansion, highly effective means for masking noise introduced by the record medium, and which enables artistically acceptable reproduction of a compressed record, even without expansion. By subjecting the reproduced signal to expansion in a manner complementary to the compression effected prior to recording, noise introduced by the record medium is reduced, and substantially the entire dynamic range can be restored. The filter network in the control signal generator prevents small rapid changes in signal level from changing the gain of the multipliers which might otherwise be heard in the playback of the compressed record, such as when the same note played by two instruments are not of exactly the same frequency and causes the signal to go to zero from time to time. While the ear may not hear this, unless account is taken of the resulting rather drastic changes in amplitude at a fairly rapid rate, one would hear the rapid changes in gain and perceive a sort of "flutter", as if the instruments were quickly moving toward and away from the listener. The present system eliminates this unnatural and disturbing consequence by providing a deadband in selected signal paths of the filter network. Further, the provision of separate signal paths for fast and slow components of an input signal effectively handles the situation where, for example, a high amplitude drum beat is suddenly superimposed on a fairly steady state lower amplitude musical signal. Known prior art compressors having a very fast attack time, of the order of a few milliseconds, and a slow decay time, of the order of a few hundred milliseconds, would very quickly reduce the gain of the compressor in response to the drum beat, but because of the slow decay time, several hundred milliseconds would be required to return the gain to its previous value, long after the drum beat has passed. In the present circuit, on the other hand, a suddenly applied drum beat will, in most cases, generate a control signal almost entirely through the "fast" branch containing high pass filter 24 (FIG. 1), and the steady state signal will go almost entirely through the "slow" signal path containing low pass filter 36. The effect is that during the short period of the drum beat, which may be of the order of 20 milliseconds, the gain of the compressor will be reduced but will then go back to its previous value as soon as the drum beat signal is over.

The specific embodiment described above is susceptible of modification in form and detail within the scope of the invention, and to adapt it for use in applications other than the described phonograph recording/reproducing system. Thus, for example, the level of the break points of the compressor and expander transfer characteristics may be different from those specifically mentioned, and the time constants of the filters in the control generator circuit are susceptible of some latitude. The disclosed companding system can also be used for recording/reproducing speech and music audio on tape cassettes and on video discs; maximum advantage of the system will be gained in these applications, in which the spectrum of the noise is different than for phonograph records, by suitably pre-equalizing the noise according to loudness contour so that the ear will be equally sensitive to noise in any frequency band. The described compressor also has applicability in broadcasting, such as for stereo broadcasting of audio on television, or for FM radio, if preceded and followed by suitable pre-filtering and post-filtering, respectively, to modify the noise characteristics to optimize performance. The invention, therefore, is intended to embrace all such modifications as come within the scope of the following claims.

I claim:

1. In a circuit for the automatic compression or expansion of a signal between its input and its output, the circuit having a useful signal path connected between its input and its output and containing an electronically controllable variable gain device for varying the gain between the circuit input and output, and control signal generating means for generating responsively to the input signal to the useful signal path a control signal and for applying the control signal to the variable gain device for causing the gain between the input and the output of the useful signal path to have a value dependent on the value of the control signal, wherein said control signal generating means comprises:

rectifier means responsive to said input signal for producing a rectified signal having a level proportional to the amplitude of the input signal, a relatively fast-acting short time constant smoothing filter connected to receive said rectified signal for filtering ripple therefrom and producing a direct voltage output the level of which substantially follows dynamic variations of the applied rectified signal, and a network of signal paths having first and second primary branches having a common input terminal connected to receive the direct voltage from said smoothing filter and a common output terminal connected to said variable gain device for applying a control signal thereto, said first primary branch including relatively fast-acting high pass filter means and a first unidirectional conducting device exhibiting a predetermined forward voltage drop for transmitting to the common output terminal only signals exhibiting a large, fast increase in amplitude sufficient to exceed the said forward voltage drop to cause said first unidirectional conducting device to conduct, and said second primary branch including first and at least second signal paths, said first signal path comprising relatively long time constant low pass filter means for transmitting to the common output terminal any direct voltage signals exhibiting small, slow changes in amplitude, and said at least second signal path comprising a second unidirectional conducting device exhibiting a predetermined forward voltage drop connected in series with second low pass filter means, said second unidirectional conducting device being poled to transmit to the common output terminal only signals exhibiting a relatively slow increase in amplitude sufficient to exceed the forward voltage drop of the second unidirectional conducting device to cause it to conduct.

2. Circuit for the automatic compression or expansion of a signal according to claim 1, wherein said second low pass filter means has an attack time constant substantially equal to the decay time constant of the high pass filter means in said first primary branch.

3. Circuit for the automatic compression or expansion of a signal according to claim 2, wherein said second primary branch includes said first signal path, said at least second signal path, and a third signal path, and wherein said third signal path comprises a third unidirectional conducting device exhibiting a predetermined forward voltage drop connected in series with third low pass filter means, said third unidirectional conducting device being poled to transmit to the common output terminal only signals exhibiting a relatively slow decrease in amplitude sufficient to exceed the forward voltage drop of said third unidirectional conducting device to cause it to conduct, and wherein said third low pass filter means has a time constant significantly shorter than the time constant of said first low pass filter means.

4. Circuit for the automatic compression or expansion of a signal according to claim 3, wherein each of said unidirectional conducting devices is a diode exhibiting a predetermined forward voltage drop.

5. Circuit for the automatic compression or expansion of a signal according to claim 3,
wherein the decay time constant of the high pass filter means in said first primary branch is about 30 milliseconds, wherein the attack time constant of said first low pass filter means in the first signal path of said second primary branch is about 2 seconds, wherein the attack time constant of said second low pass filter means in the said at least second signal path of said second primary branch is about 30 milliseconds, and wherein the attack time constant of said third low pass filter means in the third signal path of said second primary branch is about 200 milliseconds.

6. Circuit for the automatic compression or expansion of a signal according to claim 1 or 3, wherein said rectifier means includes a source of DC voltage for establishing a threshold for causing said rectifier means to produce a rectified signal having the magnitude of said DC voltage when the amplitude of the input signal is less than the threshold, and to produce a rectified signal proportional to the amplitude of the input signal when the input signal level exceeds said threshold.

7. Circuit for the automatic compression or expansion of a signal according to claim 1, wherein the said network further comprises first summing means for summing any signals transmitted by the said first and second signal paths of said second primary branch and producing a first sum signal, and second summing means having the said common output terminal as its output terminal for summing said first sum signal with any signals transmitted by the said first primary branch and producing the said control signal.

8. Circuit for the automatic compression or expansion of a signal according to claim 3, wherein the said network further comprises first summing means for summing any signals transmitted by the said first, second and third signal paths of said second primary branch and producing a first sum signal, and second summing means having the said common output terminal as its output terminal for summing said first sum signal with any signals transmitted by the said first primary branch and producing the said control signal.

9. Circuit for the automatic compression or expansion of a signal according to claim 1 or 7, wherein the decay time constant of the high pass filter means in said first primary branch is about 30 milliseconds, wherein the attack time constant of said first low pass filter means in the first signal path of said second primary branch is about 2 seconds, and wherein the attack time constant of said second low pass filter means in the said at least second signal path of said second primary branch is about 30 milliseconds.

10. An electronic circuit for compressing or expanding the dynamic range of an electrical input signal comprising a variable gain stage for amplifying the input signal, and control signal generating means including rectifier means responsive to the input signal to produce a rectified signal having a level proportional to the amplitude of the input signal and which substantially follows dynamic variations of the input signal, said variable gain stage including means for controlling the gain thereof as a function of the rectified signal level, the circuit characterized in that the control signal generating means comprises:

a network of signal paths having a common input terminal for receiving the said rectified signal and a common output terminal connected to the variable gain stage for coupling a control signal thereto, the said network comprising a first signal path including a first unidirectional conducting device exhibiting a predetermined forward voltage drop for transmitting to the common output terminal only signals exhibiting a fast, large increase in amplitude sufficient to exceed the said forward voltage drop to cause said first unidirectional conducting device to conduct, and means for terminating conduction through the said first signal path after a relatively short time period, a second signal path consisting of a first relatively long time constant low pass filter means for transmitting to the common output terminal any signal exhibiting small, slow changes in amplitude, and a third signal path comprising a second unidirectional conducting device exhibiting a predetermined forward voltage drop connected in series with second low pass filter means, the second unidirectional conducting device being poled to transmit to the common output terminal only signals exhibiting a relatively slow increase in amplitude sufficient to exceed the forward voltage drop of the second unidirectional conducting device to cause it to conduct.

11. An electronic circuit according to claim 10, wherein the said network further includes a fourth signal path comprising a third unidirectional conducting device exhibiting a predetermined forward voltage drop connected in series with third low pass filter means having a time constant significantly shorter than the time constant of said first low pass filter means, said third unidirectional conducting device being poled to transmit to the common output terminal only signals exhibiting a relatively slow decrease in amplitude sufficient to exceed the forward voltage drop of said third unidirectional conducting device to cause it to conduct.

12. An electronic circuit according to claim 11, wherein the attack time constant of the said first low pass filter means is about two seconds, wherein the attack time constant of the said second low pass filter means is about 30 milliseconds, wherein the attack time constant of the said third low pass filter means is about 200 milliseconds, and wherein the said relatively short time period is about 30 milliseconds.

13. An electronic circuit according to claim 10 wherein the said network further comprises first summing means for summing any signals transmitted by the said second and third signal paths and producing a first sum signal, and second summing means having the said common output terminal as its output terminal for summing said first sum signal with any signals transmitted by the said first signal path and producing the said control signal.

14. An electronic circuit according to claim 11 wherein the said network further comprises first summing means for summing any signals transmitted by the said second, third and fourth signal paths and producing a first sum signal, and second summing means having the said common output terminal as its output terminal for summing said first sum signal with any signals transmitted by the said first signal path and producing the said control signal.

15. An electronic circuit according to claim 10 or 13, wherein the attack time constant of the said first low pass filter means is about two seconds, wherein the attack time constant of the said second low pass filter means is about 30 milliseconds, and wherein said relatively short time period is about 30 milliseconds.

16. A circuit for compressing or expanding the dynamic range of an input signal comprising a variable gain stage for amplifying the input signal, and control signal generating means including rectifier means responsive to the input signal to produce a rectified signal having a level proportional to the amplitude of the input signal and which substantially follows dynamic variations of the input signal, said variable gain stage including means for controlling the gain thereof as a function of the rectified signal level, the circuit characterized in that the control signal generating means includes
   a network of at least three signal paths having differing time constants, said network having a common input terminal for receiving said rectified signal and a common output terminal connected to the variable gain stage for coupling a control signal thereto,
   all except one of said signal paths each including means for causing the respective path to be conductive only in response to said rectified signal exhibiting a change in amplitude sufficient to exceed a predetermined voltage, and
   the said one of said signal paths being conductive responsively to any differential in voltage between said common input and output terminals.

17. A circuit for compressing or expanding the dynamic range of an input signal according to claim 16, wherein said network includes in addition to the said one signal path at least second and third signal paths each including a unidirectional conducting device exhibiting a forward voltage drop substantially equal to said predetermined voltage,
   the unidirectional conducting device in said second signal path being poled to conduct in response to said rectified signal exhibiting an increase in amplitude sufficient to exceed said predetermined voltage, and the unidirectional conducting device in said third signal path being poled to conduct in response to said rectified signal exhibiting a decrease in amplitude sufficient to exceed said predetermined voltage level.

18. A circuit for compressing or expanding the dynamic range of an input signal according to claim 17, wherein said network further includes a fourth signal path including a unidirectional conducting device poled in the same direction as the unidirectional conducting device in said second signal path and exhibiting a forward voltage drop substantially equal to said predetermined voltage.

19. A circuit for compressing or expanding the dynamic range of an input signal according to claim 17, wherein the said one signal path includes first relatively long time constant low pass filter means,
   wherein said second signal path further includes relatively fast-acting high pass filter means, and
   wherein said third signal path further includes second low pass filter means having an attack time constant significantly longer than the decay time constant of said high pass filter means.

20. A circuit for compressing or expanding the dynamic range of an input signal according to claim 18,
   wherein the said one signal path includes first relatively long time constant low pass filter means,
   wherein said second signal path further includes relatively fast-acting high pass filter means,
   wherein said third signal path further includes second low pass filter means having an attack time constant significantly longer than the decay time constant of said high pass filter means, and
   wherein said fourth signal path further includes third low pass filter means having an attack time constant substantially equal to the decay time constant of said high pass filter means.

21. A circuit for compressing or expanding the dynamic range of an input signal according to claim 17 or 19,
   wherein the said one signal path has an attack time constant of about two seconds,
   wherein said second signal path has a decay time constant of about 30 milliseconds, and
   wherein said third signal path has an attack time constant of about 200 milliseconds.

22. A circuit for compressing or expanding the dynamic range of an input signal according to claim 18 or 20,
   wherein the said one signal path has an attack time constant of about two seconds,
   wherein said second signal path has a decay time constant of about 30 milliseconds,
   wherein said third signal path has an attack time constant of about 200 milliseconds, and
   wherein said fourth signal path has an attack time constant of about 30 milliseconds.

23. A circuit for compressing or expanding an input signal according to claim 21, wherein said network further comprises
   first summing means for summing any signals transmitted by the said one and the said third signal paths and producing a first sum signal, and
   second summing means having said common output terminal as its output terminal for summing said first sum signal with any signals transmitted by said second signal path and producing said control signal.

24. A circuit for compressing or expanding an input signal according to claim 22, wherein said network further comprises
   first summing means for summing any signals transmitted by the said one and the said third and fourth signal paths and producing a first sum signal, and
   second summing means having said common output terminal as its output terminal for summing said first sum signal with any signals transmitted by said second signal path and producing said control signal.

25. A circuit for compressing or expanding an input signal according to claim 17 or 18, wherein said unidirectional conducting devices are diodes.

* * * * *

Disclaimer 4,376,916.—*John B. Glaberson,* Stamford, Conn. SIGNAL COMPRESSION AND EXPANSION SYSTEM. Patent dated Mar. 15, 1983. Disclaimer filed May 5, 1983, by the assignee, *CBS, Inc.*

Hereby enters this disclaimer to claims 16 and 17 of said patent.

[*Official Gazette July 5, 1983.*]